(12) United States Patent
Pal et al.

(10) Patent No.: US 6,272,567 B1
(45) Date of Patent: Aug. 7, 2001

(54) SYSTEM FOR INTERPOSING A MULTI-PORT INTERNALLY CACHED DRAM IN A CONTROL PATH FOR TEMPORARILY STORING MULTICAST START OF PACKET DATA UNTIL SUCH CAN BE PASSED

(75) Inventors: Subhasis Pal, Winchester; Rajib Ray, Weymouth; Zbigniew Opalka, Harvard, all of MA (US)

(73) Assignee: Nexabit Networks, Inc., Marlboro, MA (US)

( * ) Notice: Subject to any disclaimer, the term of this patent is extended or adjusted under 35 U.S.C. 154(b) by 0 days.

(21) Appl. No.: 09/200,377
(22) Filed: Nov. 24, 1998
(51) Int. Cl.[7] ............................................... G06F 13/14
(52) U.S. Cl. ............................ 710/56; 710/2; 711/105; 711/119
(58) Field of Search ........................ 710/56, 2; 711/105, 711/119

(56) References Cited

U.S. PATENT DOCUMENTS

| | | | |
|---|---|---|---|
| 5,799,209 | * 8/1998 | Chatter | 710/56 |
| 5,918,074 | * 6/1999 | Wright et al. | 370/389 |
| 6,003,121 | * 12/1999 | Wirt | 711/170 |
| 6,067,595 | * 5/2000 | Lindenstruth | 710/129 |
| 6,078,536 | * 6/2000 | Moon et al. | 365/201 |
| 6,085,290 | * 7/2000 | Smith et al. | 711/131 |
| 6,108,758 | * 8/2000 | Liu | 711/167 |
| 6,112,267 | * 8/2000 | McCormack et al. | 710/52 |
| 6,122,680 | * 9/2000 | Holm et al. | 710/52 |
| 6,138,219 | * 10/2000 | Soman et al. | 711/149 |

* cited by examiner

Primary Examiner—Thomas Lee
Assistant Examiner—Abdelmoniem Elamin
(74) Attorney, Agent, or Firm—Rines and Rines

(57) ABSTRACT

A new data packet cell control method and apparatus, particularly, though not exclusively, for use with I/O packet cell source and destination resource networks using shared central multi-port internally cached dynamic random access memory (AMPIC DRAM), wherein a separate control path architecture is used, also incorporating AMPIC DRAM technology, to obviate problems with data traffic congestion resulting from significant I/O resource and for bandwidth requirement increases, and doing so while enabling scaling with data path, and retaining quality of service and increased multicast functionality, as well.

32 Claims, 9 Drawing Sheets

Figure 1:
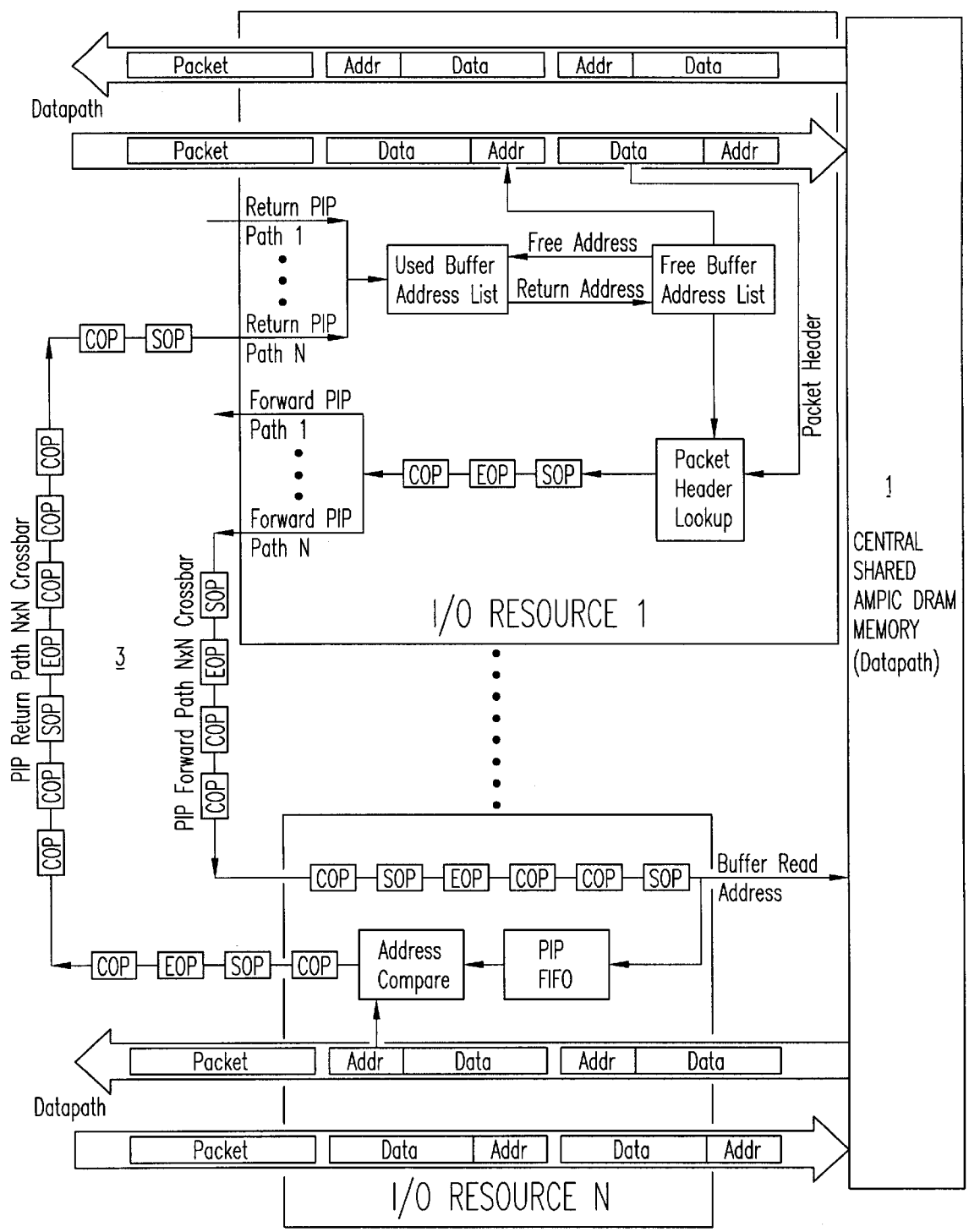

SYSTEM FOR INTERPOSING A MULTI-PORT INTERNALLY CACHED DRAM IN A CONTROL PATH FOR TEMPORARILY STORING MULTICAST START OF PACKET DATA UNTIL SUCH CAN BE PASSED

The present invention relates to systems that switch and route data packets and cells amongst I/O source and destination resources through shared central memory cores comprised of multi-port internally cached dynamic random access memory chips, termed AMPIC DRAMs, of the type described in U.S. Pat. No. 5,799,209 issued Aug. 25, 1998 to Mukesh Chatter; being more particularly concerned with the control path section of such systems and problems with data traffic congestion created as the number of I/O resources in the system, and the system bandwidth requirements significantly increase, requiring a novel control path architecture that can scale with the datapath while retaining quality of services (QOS) and multicast features.

BACKGROUND OF INVENTION

The breakthrough afforded by the Chatter AMPIC DRAM architecture of data switching, and switching and routing amongst network I/O source and destination resources, as described in the above-referenced patent, has enabled orders of magnitude faster transfer of blocks of data internal to the chip, and the accommodation of significantly higher numbers of resources, with the reduction of current serious bandwidth limitations. This architecture has also given rise to higher performance, lower system latency, less data packet buffer memory requirements, better QOS features, and true multicast operation, which current and traditional networking architectures have been unable to achieve.

As the number of I/O resources in such systems explodes, and with it the concomitant demand for even further increases in bandwidth, however, the data packet information packet itself (herein termed "PIP") becomes the limiting factor in this type of system, It is to the addressing of these issues through a novel control path architecture—itself adopting and using the AMPIC DATA technology also in the control path—that the present invention is concerned. The invention, indeed, creates a control path architecture for such AMPIC DATA switching and routing systems that scales with the data path, while still maintaining QOS functionality and providing improved multicast performance.

OBJECTS OF INVENTION

It is a primary object of the present invention, accordingly, to provide in systems for switching and routing data packets and/or cells amongst I/O source and destination resources through the shared memory AMPIC DRAM cores of said Chatter patent, a new and improved method of and system for obviating data packet congestion limitations with significantly increased I/O resources, that adopts and uses the AMPIC DRAM technology also within the control path architecture of the system, and that does so with features of scalability with the data path, while maintaining QOS and improved multicast features.

A further object is to provide a novel network control path architecture of more general utility, as well.

Other and further objects will be explained hereinafter and are more particularly delineated in the appended claims.

SUMMARY

In summary, however, from one of its important aspects, the invention embraces in a network for interfacing parallel I/O data packet information packets (PIP) source resources with I/O destination resources through a central shared memory datapath comprised of a central shared multi-port internally cached DRAM memory system (AMPIC DRAM) and a separate control path therefor, and wherein each I/O resource has the capability simultaneously to receive PIP data stream traffic from all other I/O resources, a method of eliminating PIP traffic congestion as the number of I/O resources and/or bandwidth requirements significantly increase, that comprises, interposing an AMPIC DRAM system in the control path for simultaneously absorbing and storing all PIP streams without stalling an I/O source resource incoming data stream.

Preferred and best mode designs, systems and operational methods therefor are later described.

DRAWINGS

Figure 2:
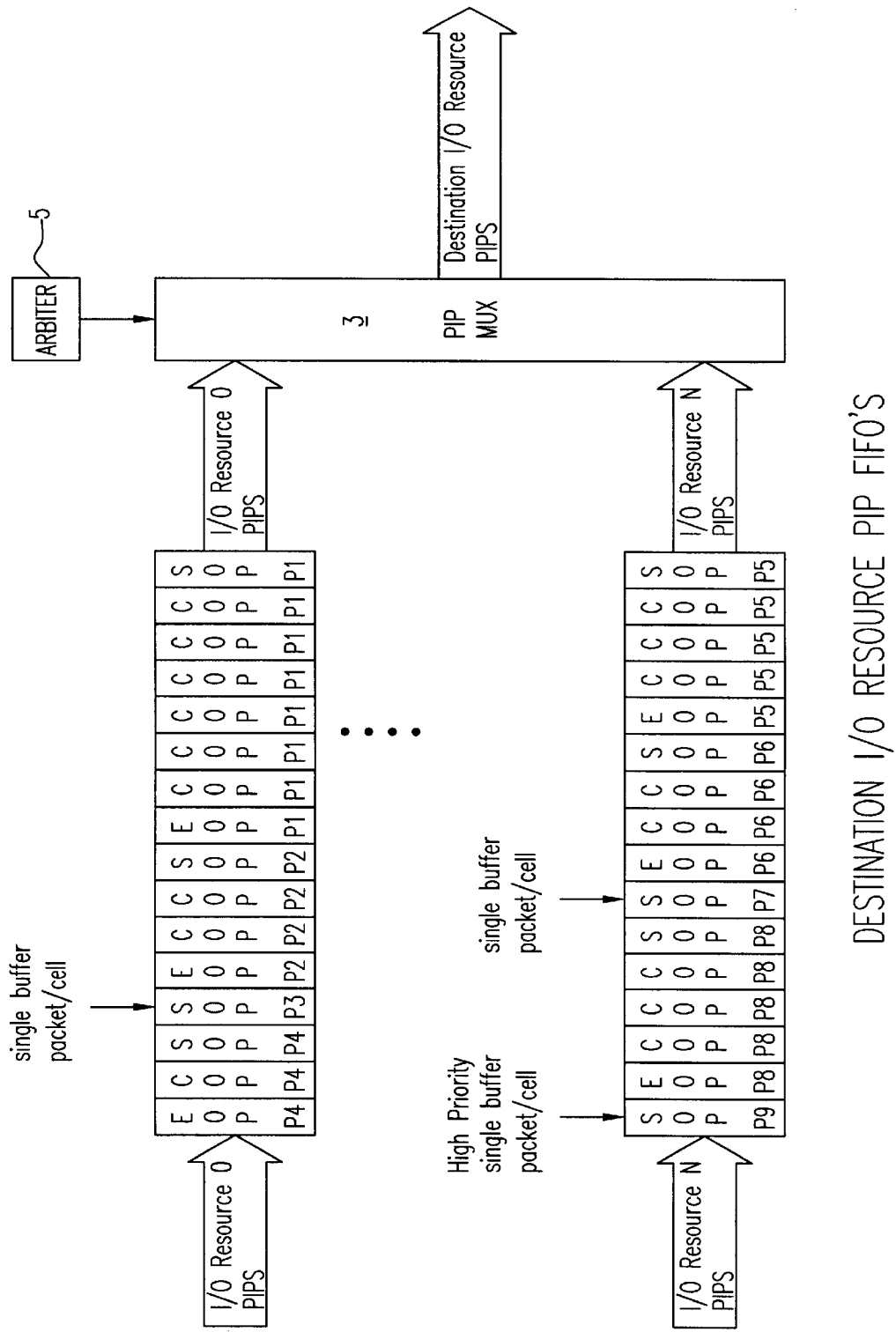
Figure 3:
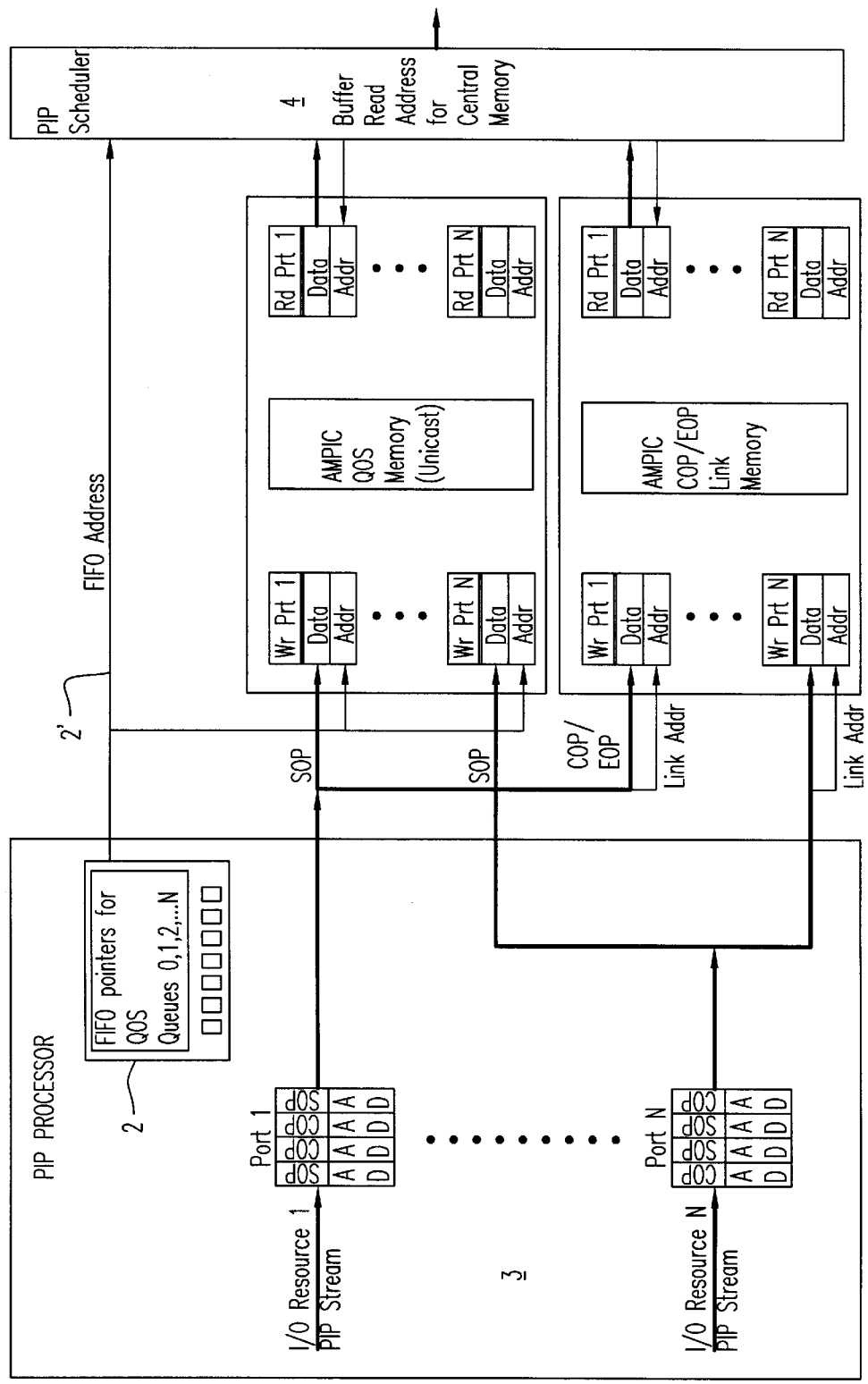
Figure 4:
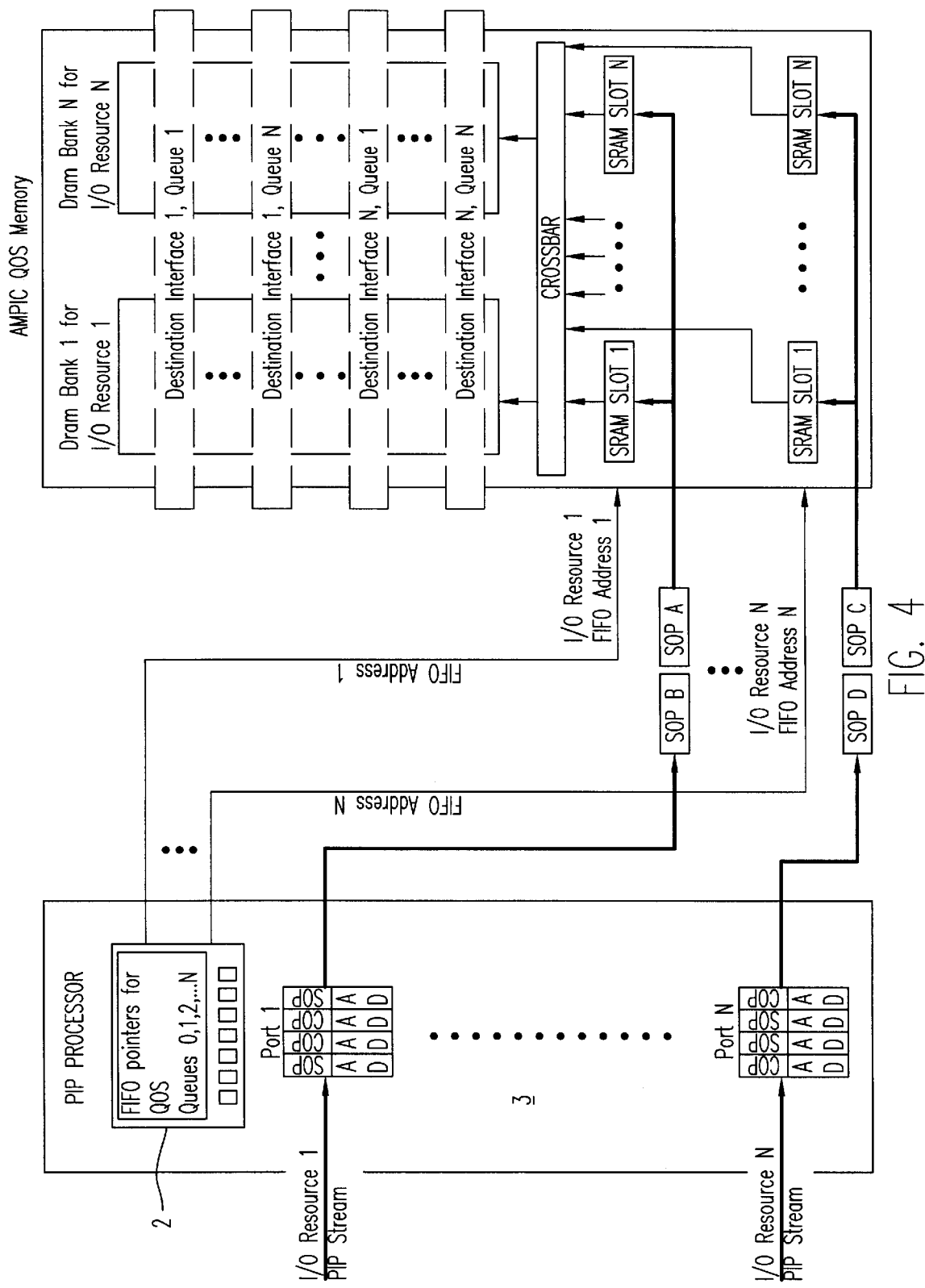
Figure 5:
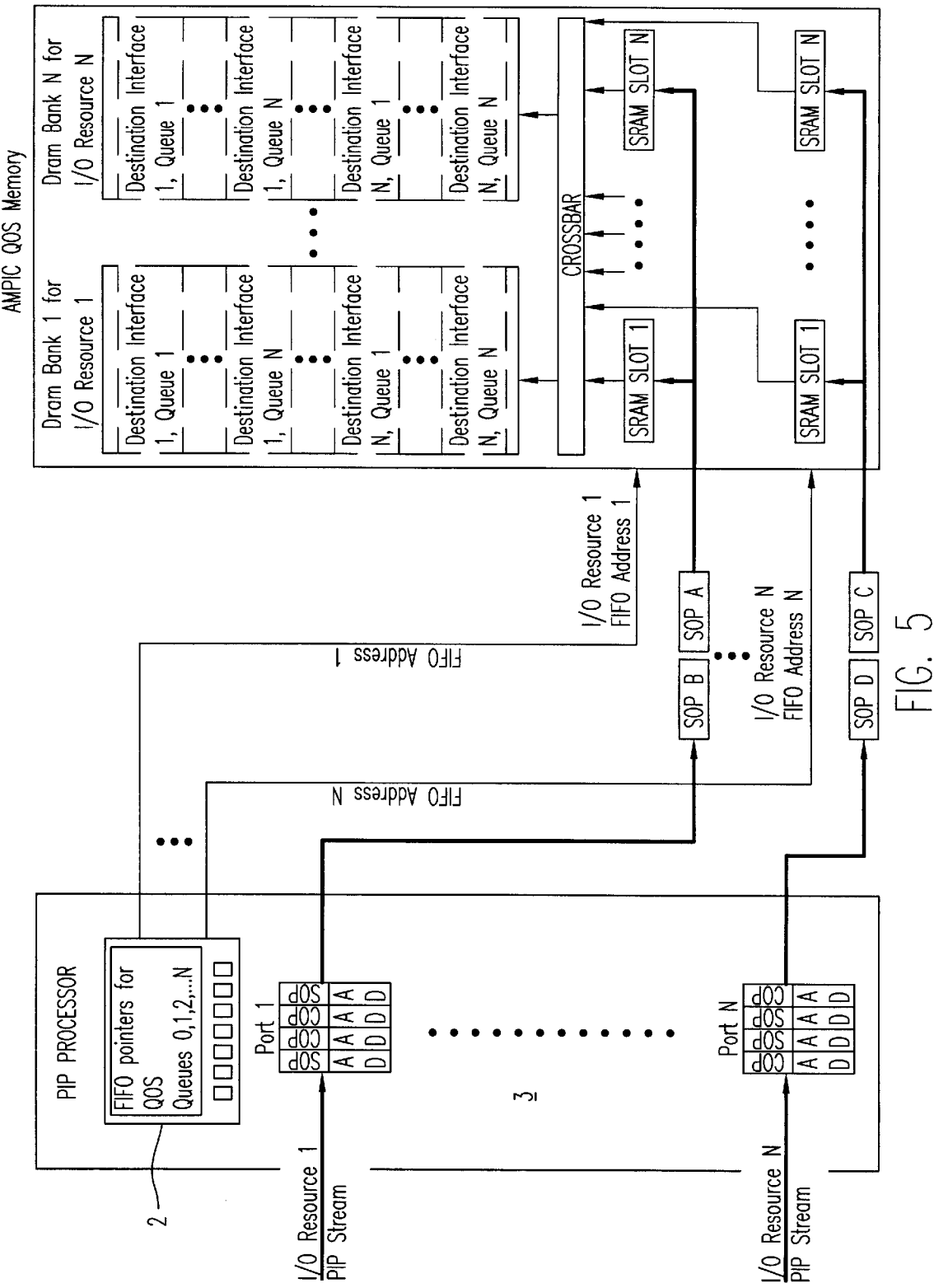
Figure 6:
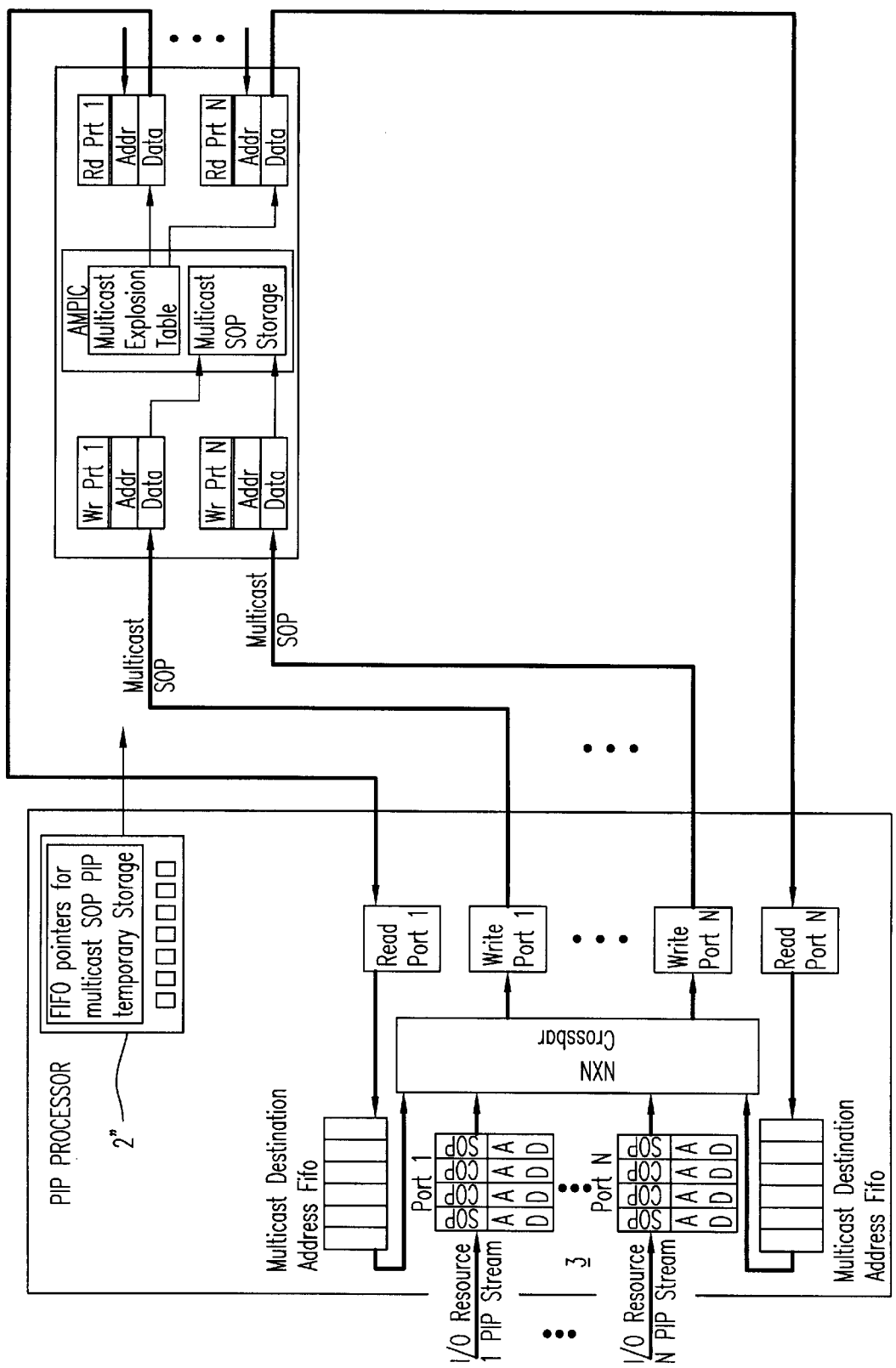
Figure 7:
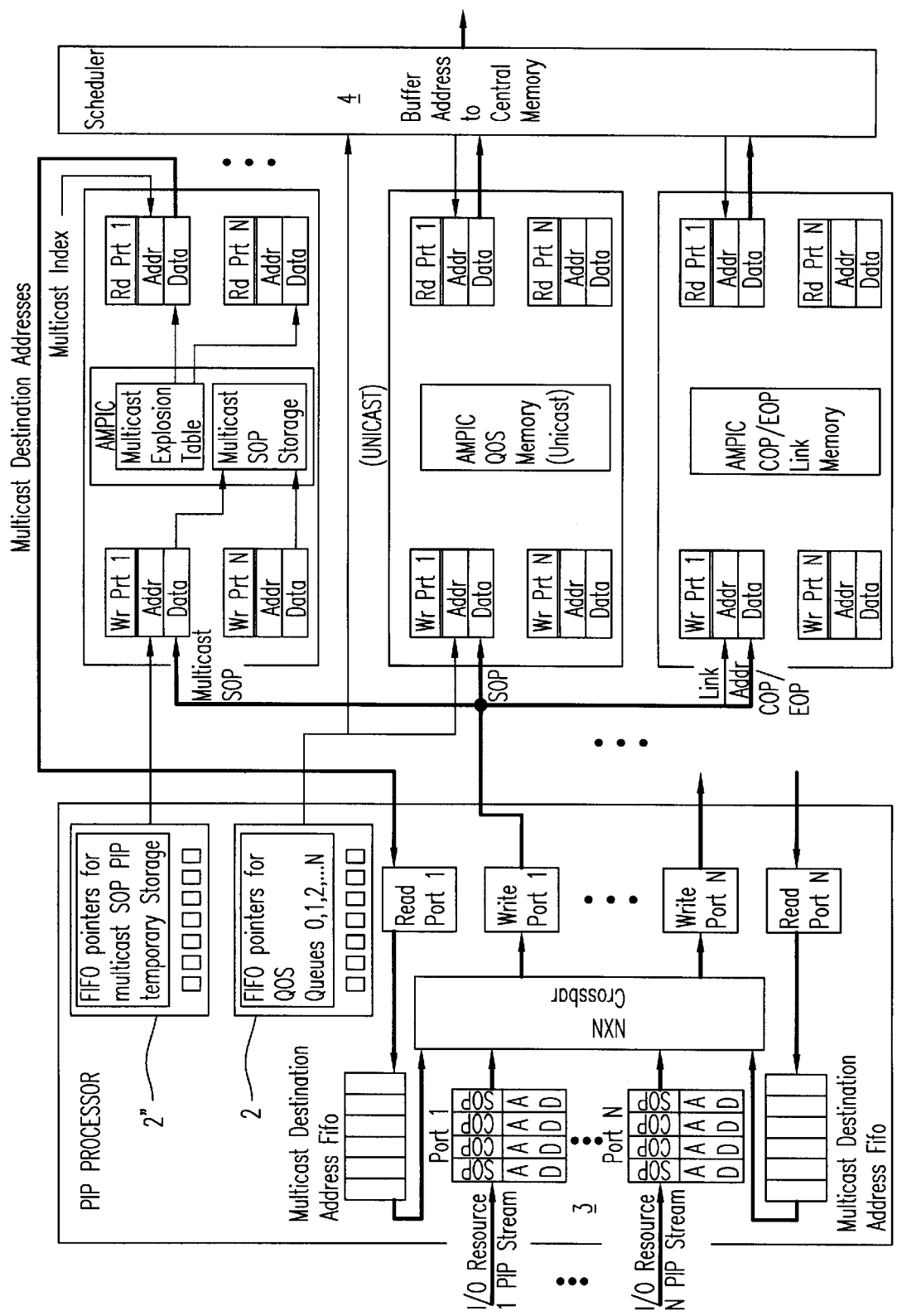
Figure 8:
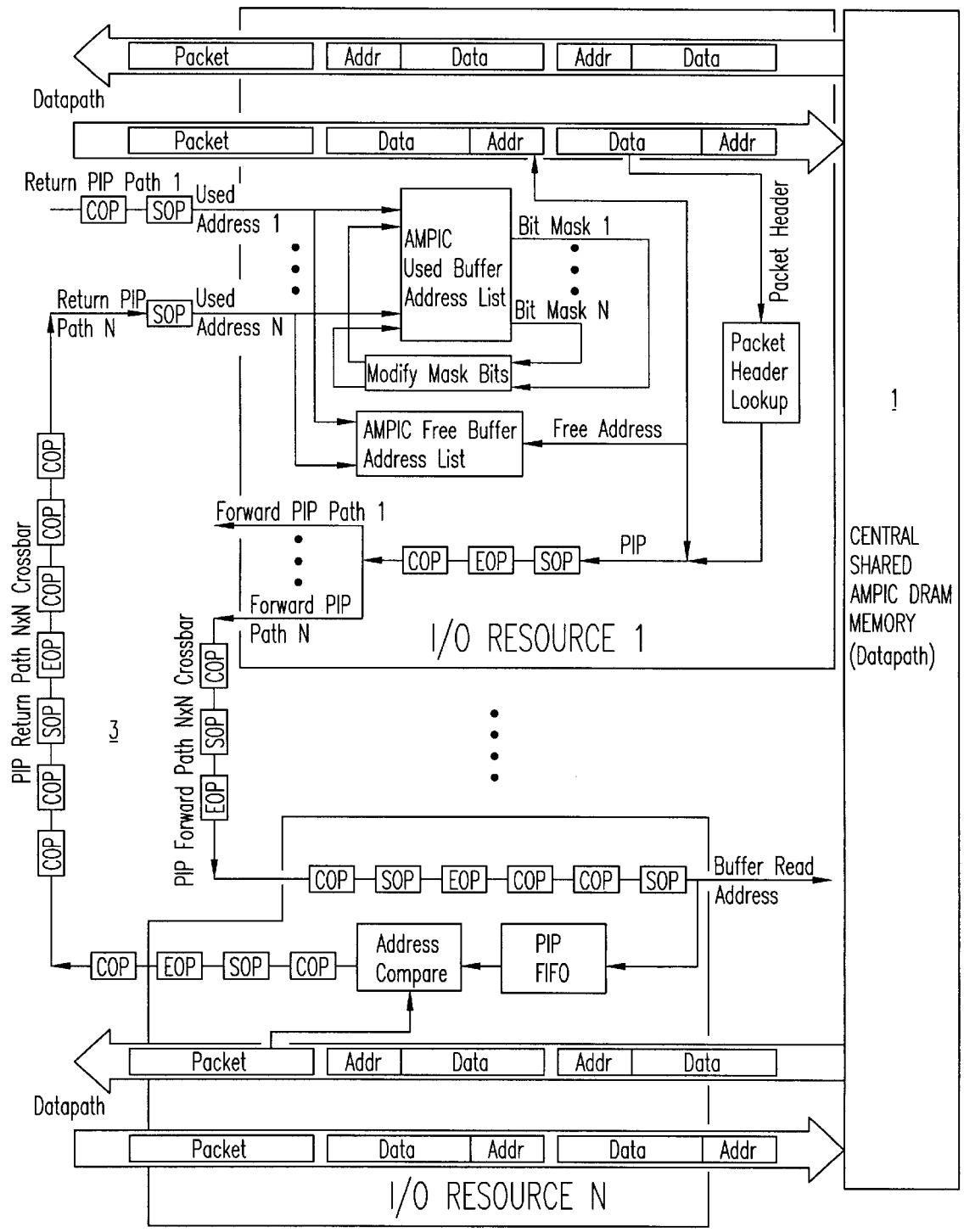
Figure 9:
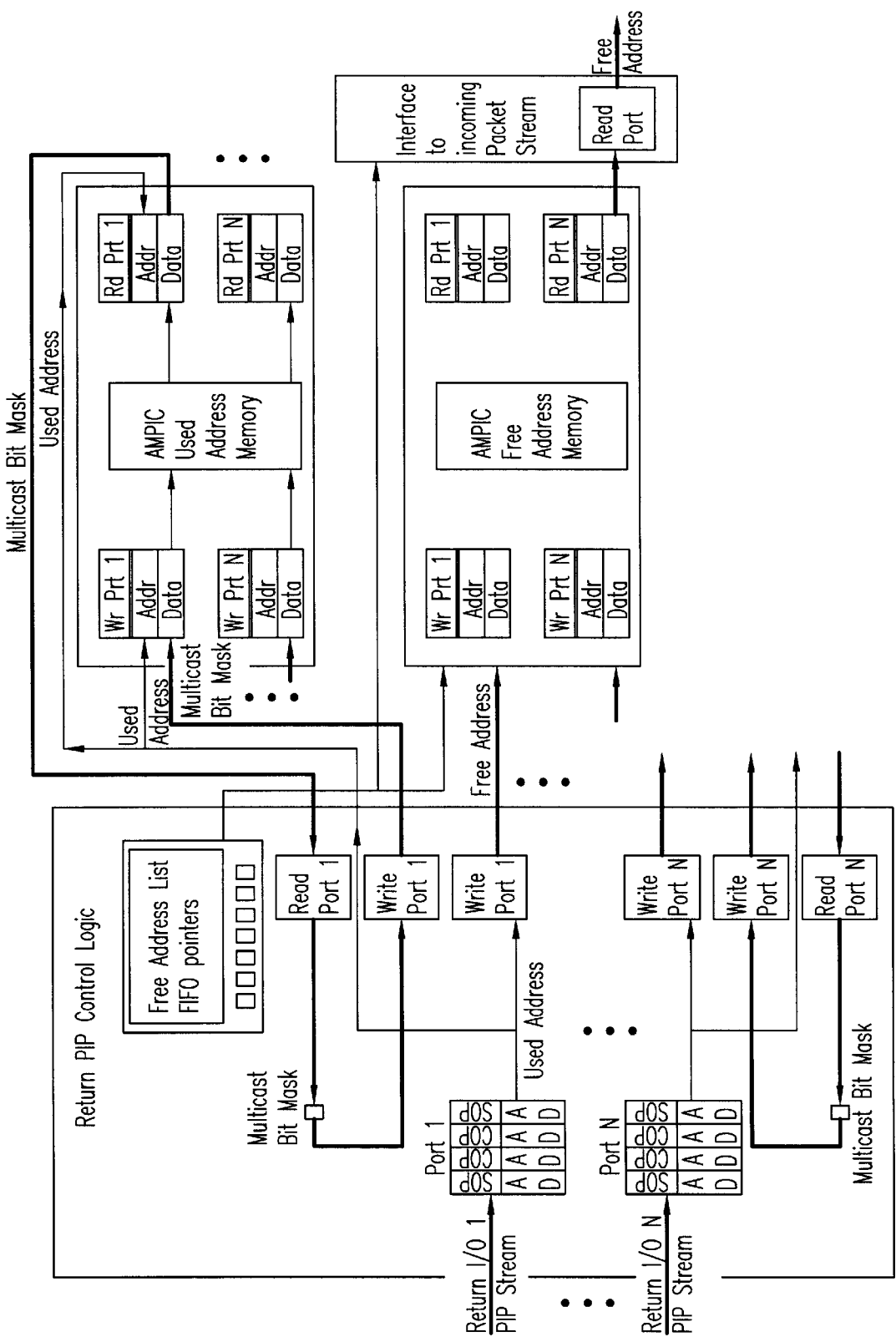

The invention will now be explained with reference to the accompanying drawings, FIG. 1 of which is a combined schematic and data flow diagram illustrating the operation of the AMPIC DRAM technology for central shared memory, as described in said Chatter patent, and which, in accordance with the present invention, is to be now incorporated, also, into the network control path, FIG. 2 is a similar diagram illustrating particularly the PIP fifo (first in, first out) flow to destination I/O resources;

FIG. 3 illustrates the novel control path of the present invention in preferred form for handling unicast datapath traffic flow;

FIGS. 4 and 5 are similar to FIG. 3, detailing in FIG. 4 the preferred partitioning of the QOS queues across the DRAM banks, and in FIG. 5, a modification wherein the memory partitioning allows a serial port to write only to a dedicated DRAM bank; and FIGS. 6 and 7 respectively illustrate the preferred multicast control path of the invention, and the combined multicast and unicast control paths, and FIGS. 8 and 9 are respectively similar to FIGS. 1 and 7 for a modification wherein AMPIC DRAMs are employed as used and free address buffers to obviate possible PIP return path congestion.

PREFERRED EMBODIMENT(S) OF INVENTION

While involving improved control path architecture for multiple I/O source and destination data routing systems generally, the present invention is particularly designed for and most useful in the before-mentioned Chatter switching and routing technique of said patent.

Since the present invention also employs the Chatter AMPIC DRAM technology, in a novel way,—this time in the system control path architecture, as distinguished from the Chatter use in the central core memory,—it is believed useful first briefly to review the nature of the AMPIC DRAM operation in the central core memory setting of said patent

The AMPIC DRAM as Central Core Memory

This technique enables obviating DRAM system bandwidth limitations, materially increasing data transfer speed, materially reducing bus arbitration requirements, enabling increased I/O resource interfacing and at reduced cost and lower power consumption, through the equipping of each DRAM unit with at least one supplemental serial data port for interfacing through a corresponding serial interface with an external I/O data resource; providing internally of each DRAM a buffer for each of the serial interfaces; and with a switching module directly interposed between the buffers and the serial interfaces, and causing the arbitrative connecting of the random serial interfaces to the random buffers by dynamically configuring the switching of the switching module as appropriate for the desired data routability, and wherein the number of the serial interfaces is independent of the number of buffers and the number of serial interfaces varies under the dynamic configuration This technique of providing a multi-port internally cached DRAM system (AMPIC DRAM), utilizing independent serial interfaces and buffers arbitratively connected under a dynamic configuration, is useful for alleviating parallel data competition for access to a common system bus interface, both where an external master controller such as a CPU is used, having parallel data ports and connected dynamic random access memory (DRAM) and with competition for access to such a common bus interface, and, also for internal common bus data transfer competition alleviation within the system, as well, as described in said patent.

In the implementation where a master controller (CPU) is used, the multi-port internally cached DRAM (AMPIC DRAM) comprises a plurality of independent serial data interfaces each connected between a separate external I/O resource and internal DRAM memory through corresponding buffers: a switching module directly interposed between the serial interfaces and the buffers, and a switching module logic control for the arbitrative connecting of the random serial interfaces to the random buffers under the before-mentioned dynamic configuration by the bus controller for switching allocation as appropriate for the desired data routability, and, as above stated, wherein the number of the serial interfaces is independent of the number of buffers and the number of serial interfaces varies under the dynamic configuration. As taught in said patent, the switching module may comprise one or more multiplexers or cross bar switches, or a combination thereof.

The buffers are data packet buffers and means is provided for performing arbitration for bus interface access amongst the various active packet buffers, and with no arbitration required to receive or transmit data from or to the packet buffers via the serial interfaces. The AMPIC DRAM switching module, moreover, assigns any buffer to any serial interface and without any intermediate step of transferring data between the buffer and the core DRAM, and with each buffer having the capability to interface with up to all the serial interfaces simultaneously when defined as a port, and with each buffer configured for the same port size as the port to which it is connected or docked.

Such a networking system based on a central shared memory datapath comprised of AMPIC DRAMS and a separate control path, has significantly higher bandwidth and lower latency over traditional networking architectures.

FIG. 1 illustrates a simplified networking system based on the Chatter AMPIC DRAM technology. A central shared memory 1 comprised of AMPIC DRAMS allow I/O resources (1 . . . N) to read and write data simultaneously with a very low probability that the internal contention for a particular DRAM bank will affect the performance of the external serial interfaces. If the shared memory utilizes an N port AMPIC DRAM device, the N I/O resources have non-blocking access to the stored data. Each I/O resource has a separate incoming and outgoing datapath, so-labeled, that can simultaneously read and write data to the shared AMPIC DRAM memory. The shared AMPIC DRAM memory, in turn, is partitioned into data buffers that have a fixed size. Incoming packets or cells are broken up into blocks of data ("Data") that are equal to or smaller in size than a data buffer. An I/O resource is allocated unused or "free" addresses for the shared AMPIC DRAM memory. As an incoming data packet is broken up into buffers, a free address is appended to the buffer before it is sent to the shared memory. The buffer will eventually be stored at this free address location ("Free Buffer Address list"). An address that has been assigned to a buffer is removed from the "free list" and added to the "used list" ("Used Buffer Address List"). A "used" address is not returned to the "free list" until a destination I/O resource retrieves the buffer from the shared memory 1. An I/O resource will extract the header information from an incoming packet or cell and performs a header lookup to determine the destination, and then the source I/O resource forwards the buffer address to a destination I/O resource in the form of the before-described "packet information packet", or "PIP". This PIP contains additional control information such as, packet byte count, quality of service (QOS), source I/O, destination I/O, multicast, etc.

If a single packet should be larger than an AMPIC buffer, it is broken up into multiple buffers, which will result in multiple PIPs. The PIPs for such multi-buffer packets must be linked together so that a packet can be reassembled by a destination I/O resource. A novel scheme creates a link list by embedding the previous buffer address along with the current buffer address within the same PIP. A command field in the PIP identifies the "start of a packet" or "SOP PIP", a "continuation of a packet" or "COP PIP", and the "end of packet" or "EOP PIP", FIG. 1. The majority of the control information is carried by the SOP PIP and it is not duplicated in the COP or EOP PIP. Each I/O resource has a dedicated link to every other I/O resource for the sole purpose of forwarding and returning PIPs. The PIP control path is a full duplex N×N crossbar switch 3 that interconnects all the I/O resources. A PIP control stream can be manipulated and processed for routing, switching and filtering decisions in parallel with the data being written to the shared memory 1. Each destination I/O resource uses the address in the PIP to read the corresponding data buffer from the shared memory. After the buffer has been read from the shared memory, the address in the buffer is compared to the address in the PIP, to guarantee that the control path is not out of sync with the datapath. The PIP is then returned to the source I/O resource, where the address is removed from the "used list" and re-cycled back into the "free list". The separation of control and data in a central shared memory system 1 results in significantly higher bandwidth and lower system latency over traditional networking architectures, as before stated.

Problems in PIP Traffic Congestion and Inadequacies of Typical Fifo/SRAM Techniques As the number of I/O resources in such a system increases and as bandwidth requirements increase, however, PIP traffic congestion becomes a limiting factor in this type of a system, as previously noted. The present invention addresses these issues by offering a new control path architecture, which also utilizes the AMPIC DRAM, this time to achieve a highly scalable, non-blocking and low latency control path, while providing greatly improved multicast performance and quality of service (QOS) functionality.

As before explained, in the Chatter system, an I/O resource must have the capability simultaneously to receive PIP streams from all the other I/O resources. FIG. 1 shows such a system with N I/O resources and a point-to-point PIP control path, as earlier described.

To appreciate potential PIP traffic congestion problems with significantly increased numbers of I/O resources and increased bandwidth requirements, consider, for example, the case where all the I/O resources are bursting packets to a single destination I/O resource. This over-subscription of an I/O resource may be a common event in typical networks. The ideal system would be able to absorb the burst of packets or cells and not stall the datapath or the control path. The datapath itself is non-blocking because of the shared central AMPIC DRAM memory core 1. The memory structure used by a destination I/O resource to store and sort control traffic, however, can have a serious impact on maintaining the optimal output bandwidth and providing true quality of service features. The rate that PIPs arrive at a destination I/O resource can be directly derived from the size of a packet and the line rate of the source I/O resource. As an illustration, a source I/O resource that has a 64 bit datapath running at 50 MHz (20 ns cycle) interfacing with an AMPIC DRAM in the data path having a buffer size of 512 bytes will require 64 clock cycles, (512 bytes/8 bytes) to fill an AMPIC data buffer.

A large packet, as before described, will be partitioned into multiple data buffers, which will result in multiple PIPs, specifically, a single SOP PIP followed by multiple COP PIPs, depending on the size of the packet, and finally an EOP PIP. Each PIP will be separated by 64 clock cycles or 1280 ns (64 cycles×20 ns). If a packet or cell is, however, smaller than the size of an AMPIC data buffer, the PIPs are generated at a faster rate. For a 64 byte packet or cell, a source I/O resource will build a partial AMPIC data buffer and generate a single SOP PIP in 8 clock cycles (64 bytes/8 bytes). A stream of back-to-back small packets or cells will thus generate significantly more PIP traffic then a stream of large packets.

Considering now the scenario of a switch router carrying small and fixed voice cells, the switcher/router system will typically have a minimum packet or cell size that it can support and still maintain a guaranteed bandwidth. The ideal control path must be able to absorb and process PIPs from all the N I/O resources simultaneously in this minimum "PIP time". In fact, the idea control path should be able to sustain this performance even if every available PIP in the system were to be sent to a single destination I/O resource.

A possible approach using typical fifo buffers for trying to provide such a solution is illustrated in FIG. 2 for a single destination I/O resource to be able to absorb all N PIP streams from all N I/O resources. Each PIP stream is there shown having a dedicated fifo that can write a PIP in the minimum PIP time, thus meeting the previously stated requirement of absorbing small packets or cells. An arbiter 5 allows a PIP fifo to dequeue a complete packet before moving on to the next fifo. When a fifo dequeues a packet, the PIPs are released at a line rate. The arbiter 5, therefore, cannot move to the next queue until all the PIPs for the same packet are dequeued. The obvious problem is that QOS cannot be provided with an approach as in FIG. 2, because of "head of line blocking". A high priority cell is there shown trapped behind low priority packets in its own fifo, as well as having to incur the delay waiting for the arbiter to service all N PIP fifos.

This difficulty can be helped, however, by separate PIP fifos for the different QOS priorities. Consider, for example, a system with 16 I/O resources, 8 QOS levels, SOP PIP size of 64 bits and a COP/EOP PIP size of 32 bits. The data bus to access the SOP fifo memory would be 8 kbits wide (64 bits×16×8), which is clearly not a feasible solution. Another option would be to have just 8 QOS fifo queues that can each absorb 16 SOP PIPs in a PIP time. A further possible approach would require a single QOS queue to be built from 128 bit wide fast SRAM. The SRAM would then be able to write two SOP PIPs in a single clock cycle, which results in 16 SOP PIPs being written in the 8 cycle minimum PIP time. This memory configuration would have to be replicated 8 times for 8 QOS queues and partitioned into separate regions for multiple interfaces. The bus to the fast SRAM would be 1 kbits wide (128 bits×8), which would be feasible on a chip with embedded SRAM. This possible solution, however, is far from ideal because the amount of embedded SRAM that can be put on a chip is fairly limited, and this directly affects the burst absorbing capacity of the system. An ideal system should not stall incoming packets or cells because of limitations in the control path PIP memory. While it is possible to use an external discrete SRAM, the 1 kbits wide bus is very expensive from a metal etch routing and real-estate perspective. Memory resources, furthermore, need to be utilized by other network functions such as routing tables, multicast tables and packet buffer memory. In addition, the COP/EOP PIPs would have to be stored in separate fifos waiting for the corresponding SOP PIP to be dequeued from a QOS queue. A serious disadvantage, indeed, of all such fifo and SRAM based approaches, moreover, is the limited amount of storage available for absorbing large bursts when over-subscription occurs. None of these solution approaches, moreover, can easily scale with increased bandwidth requirements and with smaller packet or cell sizes, which reduce the minimum PIP time and increase PIP traffic.

The AMPIC DRAM Control Path of the Invention

The present invention, on the other hand, admirably solves this problem through utilizing the novel and unique characteristics of the AMPIC DRAM to provide a highly scalable, non-blocking and low latency control path.

As previously described, a single AMPIC DRAM device used in the central shared memory core I has N ports to match N I/O resources, and it allows N I/O resources to read and write data simultaneously with a very low probability that the internal contention for a particular DRAM bank will affect the performance of the external serial interfaces. This is achieved by the internal wide-bus access to the embedded DRAM banks. The datapath AMPIC is designed to sustain reads and writes for N streams of back-to-back minimum size packets or cells with negligible contention. As before shown the maximum PIP rate is directly derived from the I/O line rate and the minimum packet or cell size, This feature has now been found to imply that the datapath AMPIC is ideal for use also in the control path for the function of simultaneously absorbing and storing N PIP streams at the maximum PIP rate. A single AMPIC DRAM device has a fixed number of buffers and port bandwidth. As AMPIC DRAMs are stacked, the port bandwidth increases and the storage capacity of a buffer increases, though the number of buffers remains fixed. This means that the control path equipped with an AMPIC DRAM will have an equal number of available PIP buffers as the central memory has data buffers, providing the memory in the control path with the ability to absorb enormous bursts of PIPs without stalling an I/O resource incoming data stream. In fact, even if every PIP in the system is sent to a single destination I/O resource, the control path so-equipped will not stall the datapath. The AMPIC DRAM in the control path, indeed, has been found to allow an I/O resource fully to utilize the central shared memory 1 when over-subscription occurs. These characteristics make it an ideal memory device for use in the control path.

As illustrated in later discussed FIG. 7, the control architecture preferably is provided with two paths, one for unicast traffic, and the other for multicast traffic. The unicast control path is shown in FIG. 3 as having two separate memories built from AMPIC DRAM chips. All N incoming PIP streams, so-labeled, pass through shallow staging fifos before being written to memory. The first or upper AMPIC DRAM memory shown, stores only SOP PIPs and will be referred to as the AMPIC QOS MEMORY. This memory is partitioned into QOS fifos, where external fifo pointers 2 in the PIP processor 3 supply addresses at 2' based on the QOS priority field stored in the SOP PIP. The SOP PIP contains all the relevant information needed for scheduling a packet or cell, such as channel and interface number, packet byte count and QOS priority.

A second AMPIC DRAM memory, shown as the lower AMPIC COP/EOP LINK MEMORY, stores only COP and EOP PIPS and will be referred to as the link table memory. A COP or EOP PIP is simply stored at the link address embedded in the PIP. The only function of the COP/EOP PIP is to supply the next buffer address in the packet or cell. This splitting of SOP and COP/EOP PIPs in the unicast path is critical for maintaining output bandwidth and predictable latency through the control path.

This may be illustrated by considering the following scenario. COP/EOP PIPs of a packet are stored with the corresponding SOP PIP in the QOS fifo memory. The COP/EOP PIPs that are destined for the same queue from N I/O resources will end up interleaved in the fifo. When PIP SCHEDULER 4 dequeues the SOP PIP, all the associated COP PIPs must follow at line rate. If PIPs for different packets are interleaved in the same QOS fifo, the COP latency is non-deterministic and, under certain traffic patterns, output line rate might be compromised. All COP/EOP PIPs are therefore simply written to the link table memory, as shown in FIG. 3, and do not interact with the QOS memory. In the previous example of an I/O resource with a 64 bit data path running at 50 MHz, processing a stream of back-to-back 64 byte packets/cells, the I/O resource will generate a stream of SOP PIPs separated by 8 clock cycles. In the event of 16 I/O resources transmitting a similar stream of PIPs to the same destination I/O resource; the QOS AMPIC memory on the destination I/O resource must be able to absorb PIPs at the maximum PIP rate of 16 SOP PIPs every 8 clock cycles. This requires a 16-port AMPIC with a data bus of 8 bits per port. If the available AMPIC has only a 4 bit port, two AMPICs can be stacked together to achieve the desired bandwidth. Should the I/O resource bandwidth double, the number of AMPICs accordingly can be doubled to meet the new maximum PIP rate.

The COP/EOP AMPIC link table memory does not, however, have to absorb PIPs at the same rate as the QOS AMPIC memory. It was previously demonstrated that, for an AMPIC data buffer size of 512 bytes, COP PIPs for the same packet are generated 64 clock cycles apart. In the worse case contention scenario for the link table memory, all 16 I/O resources have transmitted COP PIPs that have link addresses to the same DRAM bank. If the link table is comprised of a single AMPIC, the write ports (so-labeled in FIG. 3) can accept all 16 COP PIPs in 8 clock cycles (32 bits/4bits). A DRAM bank has a 3 cycle access time to load an entire 32 bit COP PIP. The DRAM can write all 16 COP PIPs in 48 cycles (16 slots×3 cycle access time). The total time to absorb the COP PIPs is 56 cycles, which includes the time to transfer the COP PIPs to the AMPIC (48 cycles+8 cycles). The subsequent 16 COP/EOP PIPs will take 64 clock cycles to arrive.

This non-blocking architecture thus guarantees that COP PIPs for the same packet are written to the link table at line rate. The scheduler 4 can dequeue SOP PIPs from the QOS memory and use the embedded byte count and bandwidth requirements for the different priority queues, to calculate the next time to send a packet. The scheduler can dequeue the remainder of the packet by stripping the link address from the SOP PIP and injecting it into the AMPIC link table. The scheduler can utilize the AMPIC stale bit or a designated valid bit to confirm that the COP is new and not an old value. After a COP PIP has been read out of the link table, the scheduler will have to write back to the same location and clear the stale bit or valid bit.

The scheduler must dequeue COP/EOP PIPs at line rate or faster in order to prevent read address starvation, which could result in the filling up of the central shared memory 1. This non-blocking link table operation of the present invention is therefore far superior to the before-discussed fifo—based approaches to a solution, because it guarantees this cannot happen.

An alternate implementation of the AMPIC link table could pack multiple COP PIPs together in the same PIP buffer. This can be useful for masking AMPIC read latency. Consider, for example, a system using an AMPIC with 256 byte buffers and in which COP PIPs for the same packet are separated by 32 clock cycles. If the AMPIC takes more than 32 clock cycles to read the next COP PIP, then the line rate cannot be maintained. By packing two COP PIPs together, the scheduler 4 has doubled the time required to read the subsequent COP PIPs. In this example, the next COP PIP would not be required for 64 clock cycles, masking the AMPIC read latency. It should be noted that packing COP PIPs together does cause the central shared memory 1 to act as a store-and-forward memory as compared to a cut-through memory. This can, therefore, result in a longer latency through the system, but this is negligible if only a few COP PIPs are stored together.

The AMPIC QOS MEMORY of FIG. 3 is partitioned into priority queues with external fifo read and write pointers. As before stated, it must be able to absorb SOP PIPs at the maximum PIP rate from N I/O resources. As previously noted, the AMPIC architecture allows N I/O resources to read and write data simultaneously with a very low probability that the internal contention for a particular DRAM bank will affect the performance of the external serial interfaces. This is achieved by the internal wide-bus access to the embedded DRAM banks. Another feature of the AMPIC that reduces contention is the I/O slot, which, as explained more fully in the Chatter patent, temporarily stores a buffer until the corresponding DRAM bank can read or write the data. Each serial port has an I/O slot for each corresponding DRAM bank. Such slots are shown in later-described FIG. 4. For example, if an AMPIC has 16 DRAM banks, each serial interface will have 16 I/O slots. If the total number of serial ports is 16, the total available I/O slots are 256 (16 slots×16 ports).

As an example, a serial interface may have written a buffer to an I/O slot at a time that the corresponding DRAM bank is currently busy. A stall condition will occur if the same serial interface attempts to write another buffer to the same DRAM bank. The chance that the next buffer will be destined for the same bank is 1/16, since the buffer addresses are randomized. Statistically, the AMPIC experiences very little contention, even at small packet sizes, because of the 256 slots that are available for temporary storage.

The QOS AMPIC of the present invention in the control path, however, cannot depend on this low probability for contention because the fifo read and write pointers are not randomized. Consider, for example, 16 SOP PIPs with the same priority destined for the same interface. If the queue is partitioned into a single DRAM bank, contention will occur immediately. It is important to note that PIP traffic can be deterministic and is dependent on the application of the system. The invention therefore arranges the priority queues in the QOS AMPIC in a way that reduces or eliminates such contention.

This is illustrated in FIG. 4 where the QOS queues are shown partitioned across the DRAM banks. The AMPIC QOS MEMORY is there shown with DRAM BANKS 1... . N for the respective I/O RESOURCES 1 . . . N, each having respective queues "Queue I... N" controlled by the "CROSS BAR" switching responsive to SRAM SLOTS, so-labeled, receiving SOP PIPs from the I/O resources. The external fifo read and write pointer 2 will increment the fifo address across the banks. The advantage of this partitioning is that N SOP PIPs can be written simultaneously to N banks. The external fifo write pointer logic simply detects how many SOP PIPs are destined for the same queue and issues N addresses simultaneously ("FIFO Address 1 . . . N").

As an illustration, with an I/O resource with 8 interfaces and 8 priority queues per interface, the total number of external pointers required to manage the QOS AMPIC memory is 64 (8×8). This scheme, as earlier noted, can encounter some contention if SOP PIPs destined for different queues randomly hit the same bank. Since the queues have no relationship to each other, however, write pointers can be considered random relative to one other. Statistically, the QOS AMPIC has the same contention as the data path AMPIC.

An alternate method of managing the queues can reduce the contention to zero but has the disadvantage of requiring a large external pointer overhead. FIG. 5 illustrates such memory partitioning that allows a serial port to write only SOP PIPs to a dedicated DRAM bank (1 . . . N for respective I/O resources 1 . . . N). In the above example, I/O resource 1 can only write to DRAM bank 1 and I/O resource N can only write to DRAM bank N. A single QOS queue has N separate pointers. A round robin arbiter (not shown) will scroll through the N pointers to decide which DRAM bank to read. This memory partitioning is essentially a single QOS output queue comprised of smaller input fifos. In the previous example, there will be 8 interfaces and 8 priority queues per interface. The total number of external pointers required to manage the QOS AMPIC memory with this partitioning is 1024 (8×8×16 banks). This is a large pointer overhead, but the contention is guaranteed to be zero.

The present invention thus provides a novel control path, which is highly scalable, non-blocking and low in latency. The invention, in addition, synergistically also greatly improves multicast performance by utilizing the AMPIC DRAM as an N-port multicast table in the control path. The capability to multicast a packet or cell to multiple destination I/O resources, interfaces or virtual circuits, is critical for important applications, such as video broadcasting. A system with a shared memory core comprised of an AMPIC DRAM, with N ports, has been found to be ideal for this function because a packet or cell can be retrieved by N I/O resources. A source I/O resource can multicast a packet or cell to N destination I/O resources by simply replicating the PIP stream N times. An I/O resource that multicasts a PIP stream must keep track of the replicated PIPs so that used addresses are only released to the free list after all the duplicated PIPs are returned. Multicasting becomes much more difficult if a destination I/O resource has to multicast to multiple interfaces or possibly thousands of virtual circuits. In such a scenario, in accordance with the present invention, a multicast table is stored in local memory on the I/O resource. A multicast SOP PIP has an index into the multicast table which points to a new destination address. The multicast explosion creates a new SOP PIP for each new destination address read from multicast table. An entry in the multicast table may also contain a pointer to another multicast entry, creating a link list of new destination addresses. In the case of virtual circuits, the multicast explosion may require the link table to store thousands of such new destination addresses.

The invention utilizes the AMPIC DRAM as such a multicast table and as temporary storage for multicast SOP PIPs. For purpose of illustration, the multicast control path for such operation is shown in FIG. 6 without the unicast control path of FIG. 4, and in FIG. 7, together with the unicast control path. A unique feature of the AMPIC DRAM is the previously stressed N port access to the same memory space. This allows the multicast logic to process N multicast SOP PIPs simultaneously. This is N times better performance than a multicast table stored in traditional memory, which would require each lookup to be done in a serial manner. Furthermore, replicating the multicast memory so lookups can occur in parallel is expensive and wastes space. The further unique feature of the AMPIC DRAM residing in the internal wide bus and the large storage capacity of a buffer, enables packing multiple destination addresses together in a single buffer, which reduces the link address overhead.

As shown in FIG. 6, an incoming multicast SOP PIO is diverted from the QOS AMPIC memory. The multicast index is stripped from the SOP PIP and injected into a read port "Rd Prt" 1 . . . N, on the AMPIC Multicast memory at "AMPIC M". A buffer containing packed destination addresses and QOS priorities is returned to the external logic. A fifo the size of an AMPIC buffer temporarily holds the new destination addresses as the multicast explosion occurs. The multicast explosion creates a new SOP PIP by replacing the destination address, QOS priority and other fields in the original SOP PIP. The original buffer address to the packet or cell, however, is not changed. This process continues until all of the packed destination addresses have been converted into new SOP PIPs. The new SOP PIPs are now treated as unicast traffic (as in FIG. 4) and are multiplexed back ("N×N Cross Bar") into the data path for the QOS AMPIC memory, FIG. 7. An arbiter (such as 5 of FIG. 2) controls the multiplexing of unicast traffic and exploded multicast traffic based on the system application. This logic is replicated N times, simultaneously to explode N multicast SOP PIPs.

Consider an example of such operation with the previous illustration of a system with 16 I/O resources and an AMPIC DRAM with 16 ports, wherein each port is 4 bits wide and the buffer size is 256 bits. A multicast table can be built from 2 AMPIC DRAM devices stacked together, resulting in a data port width of 8 bits and a buffer size of 512 bits. A single multicast destination address, QOS and other miscellaneous information is a total of 16 bits. The AMPIC buffer can store 32 packed multicast addresses (512 bits/16 bits) and can return a buffer containing 32 packed multicast addresses over an 8 bit wide data port in 64 clock cycles, (512 bits/8 bits). If 16 multicast SOP PIPs are processed simultaneously, the AMPIC DRAM can return 16 buffers or 512 (32×16 ) multicast destination addresses in 64 clock cycles. A multicast table stored in fast SRAM would take 512 cycles to read 512 destination addresses assuming a single cycle per read. The AMPIC memory thus has a clear advantage in the multicast application. If a single multicast explosion requires more destination addresses than an AMPIC buffer can store, a link address to the next buffer can be embedded in the current buffer. If AMPIC buffers are linked together in this fashion, than some storage capacity is lost to hold the link addresses. A 16 bit link address, for example, would reduce the number of packed destination addresses to 31 per buffer. The link list, however, is only limited by the amount of total available memory.

An enhancement to the invention can be further achieved by placing the link address at the beginning of the buffer, which allows the address to be stripped off and re-injected into the AMPIC before the entire buffer has been received. This scheme helps prime the pipe line, so that flow of destination addresses to the multicast logic is uninterrupted. The QOS scheduler dequeues SOP PIPs based on bandwidth requirements for different QOS priorities. The scheduler cannot predict the next time to send for an unexploded multicast SOP PIP. Furthermore, if a large multicast explosion is destined for the same interface, regular unicast traffic can potentially be blocked. For these reasons, the multicast SOP PIPs must be exploded and interleaved fairly with unicast SOP PIPs before being written to the QOS fifo queues, as above explained.

A large multicast explosion generates a flood of new SOP PIPs that must be written to the QOS AMPIC. The before-described N×N crossbar between the multicast datapath and the unicast data path, allows such exploded multicast traffic to utilize idle write ports to the QOS AMPIC memory. In the ideal case of light unicast traffic, a multicast explosion can utilize N write ports to drain the exploded multicast SOP PIPs into the QOS memory of FIG. 7. A more typical scenario, however, is the SOP PIPs generated by a multicast explosion having to share the bandwidth to the QOS AMPIC memory with the unicast traffic. In fact, heavy unicast traffic can cause the multicast SOP PIPs to back up. There may also be a case of back-to-back multicast SOP PIPs, where the first SOP PIP is undergoing a lengthy multicast explosion. Both such scenarios require incoming multicast SOP PIPs to be stored while they wait to be processed. The present invention conveniently utilizes part of the AMPIC multicast memory to store incoming multicast SOP PIPs until they can be processed. This memory can readily be organized into fifos with the external logic keeping track of the read and write pointers. By arranging this address space into fifos, multicast SOP PIPs can be pulled out in the same order they came in so that no unfairness is introduced. Since the multicast explosions only utilize the read ports, the write ports are available for accessing this fifo space. The write ports of the AMPIC multicast memory ("WrPrt"1 . . . N) must be able to absorb multicast SOP PIPs at the maximum PIP traffic rate.

Consider, for example, the previous illustration where the minimum time between SOP PIPs was shown to be 8 clock cycles for 64 byte packets, and the multicast table was comprised of two AMPICs creating a port width of 8 bits. A single port can write a 64 bit SOP PIP in 8 clock cycles, 64 bits/8 bits, which meets the minimum PIP time requirements. The 16 ports can also write 16 SOP PIPs simultaneously. This demonstrates the multicast SOP PIP memory can simultaneously absorb a continuous burst of back-to-back multicast SOP PIPs even from all 16 I/O resources.

This control path architecture of the present invention is completely scalable, depending on the requirements of the system. If better port bandwidth and greater storage capacity is required, more AMPIC DRAM chips can be stacked together, widening the port bus and increasing the size of a buffer. If more multicast SOP storage is needed, moreover, the number of AMPIC buffers can be increased by stacking AMPICs vertically or into banks, where the external logic would then view the banks as an extension of the address space. In summary, this invention utilizes the unique properties of the AMPIC DRAM also to achieve significantly better multicast performance than can be achieved with traditional, memory devices and configurations.

There is another novel feature of the invention that further improves the control path architecture by utilizing the AMPIC DRAM to alleviate PIP traffic congestion when PIPs are returned because the QOS queues are filled, or after data packet has been retrieved from the shared memory.

FIG. 8 is similar to FIG. 1 but additionally provides for alleviating PIP traffic congestion on such a PIP return path. In FIG. 8, there are shown the point-to-point connections for the PIP "forward" and "return" paths, so-labeled. An I/O resource sends the PIPs generated for an incoming packet to destination I/O resources via the "forward" PIP paths. An I/O resource returns the PIPs to a source I/O resource via the "return" PIP path, after a packet has been read from shared memory 1. After a destination I/O resource schedules a packet to be read out of shared memory, the corresponding PIPs are read out of the QOS and link table AMPIC memory, FIG. 3, as earlier described. The read addresses are stripped out of the PIP and injected into the shared memory datapath. When a data buffer is retrieved from the shared memory, the address embedded in the buffer is compared against the address in the PIP to confirm that the control path and datapath are synchronized. The PIP is then returned to the source I/O resource via the PIP "return" path. The source I/O resource recycles the buffer address by returning it to the "free" address list from the "used" address list in FIG. 1.

As an illustration, consider the previous example of a 64 byte packet, which was shown to generate PIPs at the maximum rate of a single SOP PIP every 160 ns. An I/O resource that is receiving typical unicast traffic will forward a single SOP PIP every 160 ns. The PIP return rate, however, cannot be assumed to be a PIP every 160 ns. A problem can thus arise because an SOP PIP's return latency can vary depending on how many SOP PIPs are already stored in a particular destination QOS queue. The existing SOP PIPs that are ahead of the new SOP PIP represent data that will be scheduled and transmitted on the wire before the new SOP PIP can be returned. It is important to note that a QOS queue. The existing SOP PIPs that are ahead of the new SOP PIP represent data that will be scheduled and transmitted on the wire before the new SOP PIP can be returned. It is important to note that a QOS queue can only guarantee that a worse case system latency will not be violated, but the actual latency is difficult to predict. From a customers perspective, so long as the latency through the system does not violate this requirement, then the network is providing a reliable service.

This slight variation in latency, however, can cause a bottleneck of PIPs on the N "return" paths. A source I/O resource that transmits a single SOP PIP every 160 ns might have N return paths that are idle and then encounter a burst of N returned PIPs simultaneously. The problem becomes more evident in the multicast case. If a PIP is replicated and multicast to N I/O resources, the return traffic will be much greater than the forward traffic. The memory device that stores the "used" and "free" address lists of FIG. 1 must be able to process N return PIP streams. Since an I/O resource is allocated a fixed number of addresses from the shared memory, the "used" addresses must therefore be recycled to the "free" list as fast as possible to prevent address depletion for incoming packets.

This problem is solved in accordance with the invention with a return path that actually utilizes the AMPIC DRAM for the "free" and "used" address memory, as in FIGS. 8 and 9. The "free" and "used" address list is therein partitioned into two separate memories, each built from a single AMPIC DRAM device. The AMPIC "free" address memory, FIG. 4, acts as a deep fifo with external read and write pointers. An incoming packet simply pulls a free address from the top of the fifo with external read and write pointers. An incoming packet simply pulls a free address from the top of the fifo and the external fifo read pointer increments to the next free address. A copy of the free address is appended to the data buffer and is stored in the shared memory 1. The free address and the result of the packet header lookup form a new PIP. The result of the packet header lookup also identifies a PIP as either unicast or multicast. Before an I/O resource forwards a PIP, a record must be kept of for which I/O resources the PIP is destined. A bit mask is thus created, where each bit represents a possible destination I/O resource. The appropriate bits are set based on which I/O resources will receive a copy of the PIP. If the PIP is unicast, then only a single bit will be set. The bit mask is stored in the AMPIC "used" address memory, FIG. 9, with the address that is embedded in the PIP. This scheme marks a free address as a used address. It also keeps a record of how many times the address was replicated, and to which I/O resources the PIP was destined. This bit mask will be used when the PIP is returned, to determine if a "used" address can be recycled back to the "free" address memory. The PIP is now sent to the intended destination I/O resources via the forward PIP paths.

If a PIP is identified as multicast, it is replicated 2 to N times, and is sent simultaneously on the corresponding PIP forward paths. After a destination I/O resource retrieves a buffer, the PIP is returned to the source I/O resources via the return path. The address embedded in the return PIP is used to read the corresponding bit mask from the AMPIC "used" address memory. The return PIP contains the destination I/O resource number, which is used to clear the corresponding mask bit, thus indicating that the PIP was recovered. If the updated bit mask is still a non-zero value, it is written back to the same location in the AMPIC "used" address memory. A non-zero value indicates that other I/O resources have not yet returned the multicast PIP. As the replicated PIPs return from 2 to N I/O resources, the appropriate bits are cleared and the mask is written back to the AMPIC "used" address memory. When the last PIP is returned, a cleared mask is written back to the AMPIC "used" address memory. The address is then returned to the AMPIC "free" address memory. An incoming packet can now use the recycled address.

The AMPIC DRAM offers a clear advantage over traditional memory for the above purposes because N read and write ports can be utilized to read and write N bit masks simultaneously. Furthermore, N used addresses can be recycled to the AMPIC "free" address memory simultaneously. The AMPIC DRAM has the same number of bit mask locations as the shared memory has data buffers. As previously demonstrated, the AMPIC DRAM in the return control path can read and write N PIP addresses simultaneously in the minimum PIP time, because the AMPIC utilized by the datapath can read and write N minimum size packets simultaneously. In the previous example of a system with 16 I/O resources, a required guarantee line rate for 64 byte packets, and a maximum PIP rate of 1 PIP every 8 clock cycles, there is a minimum PIP time of 160 ns (8 clock cycles×20 ns). A single 16 port AMPIC DRAM with 4 bit data ports can read and write 32 bits per port in 8 clock cycles. A system with 16 I/O resources only requires a 16 bit mask for keeping track of used address. The AMPIC "used" address memory can read 16 masks simultaneously in the 8 clock cycle minimum PIP time. Furthermore, 16 modified masks can be written back to the minimum PIP time. The AMPIC "free" address memory can also write 16 addresses simultaneously in the minimum PIP time. This means that the "used" and "free" address lists can be updated and can readily keep up with the maximum return PIP rate of 16 PIPs every 8 clock cycles. This architecture makes the PIP return path scale with the forward PIP path and the shared memory datapath Further modifications will occur to those skilled in this art, and such are considered to fall within the spirit and scope of the invention as defined in the appended claims.

What is claimed is:

1. In a network for interfacing parallel I/O data packet information packets (PIP) source resources with I/O destination resources through a central shared memory data path comprised of a central shared multi-port internally cached DRAM memory system (AMPIC DRAM) and a separate control path therefor, and wherein each I/O resource has the capability simultaneously to receive PIP data stream traffic from all the other I/O resources, a method of eliminating PIP traffic congestion as the number of I/O resources and/or bandwidth requirements significantly increase, that comprises, interposing an AMPIC DRAM system in the control path for simultaneously absorbing and storing all PIP streams without stalling an I/O source resource incoming data stream, wherein the control path is provided for unicast traffic, and the interposed AMPIC DRAM system is separated into an AMPIC Quality of Service (QOS) memory for enabling priority control, and an AMPIC LINK memory for enabling packet re-assembly at I/O destination resources.

2. The method claimed in claim 1 wherein the AMPIC QOS and AMPIC LINK memories are respectively fed start of packet (SOP) control information, and continuation of packet (COP) and end of packet (EOP) information derived from the incoming PIP stream.

3. The method as claimed in claim 2 wherein the memory in the control path is provided with a number of available PIP buffers that is equal to the number of data buffers provided in the AMPIC DRAM central memory, thereby enabling the control path to absorb enormous bursts of PIP streams without stalling an I/O resource data stream.

4. The method as claimed in claim 2 wherein the control path is also provided with a multicast data traffic control path, and in which a further AMPIC DRAM memory is interposed for temporarily storing multicast SOP PIP data.

5. The method as claimed in claim 4 wherein the multicast SOP PIPs are exploded and interleaved fairly with the unicast path SOP PIPs, and then written into QOS fifo queues.

6. The method as claimed in claim 1 wherein each I/O resource operates with AMPIC DRAM used and free buffer address list for the shared AMPIC DRAM memory, and in the event that PIPs are returned to a source I/O resource because QOS queues are filled, and in order to avoid PIP return congestion, storing the returned PIP information in the AMPIC DRAMs and, when the last PIP is returned, clearing from the AMPIC used address memory and transferring to the AMPIC free address memory.

7. The method as claimed in claim 6 wherein there are N I/O resources requiring N bit masks for keeping track of used addresses, with the AMPIC used address memory reading N masks simultaneously in said time, updating the used and free address lists and keeping up with the maximum return PIP rate, enabling the PIP return path to remain uncongested and to scale with the forward PIP path and the shared memory datapath.

8. Apparatus for use in a network for interfacing parallel I/O data packet information packets (PIP) source resources with I/O destination resources through a central shared memory data path comprised of a central shared multi-port internally cached DRAM memory system (AMPIC DRAM) and a separate control path therefor, and wherein each I/O resource has the capability simultaneously to receive PIP data stream traffic from all other I/O resources, said apparatus having an architecture for eliminating PIP traffic congestion as the number of I/O resources and/or bandwidth requirements significantly increase, that comprises an AMPIC DRAM system interposed in the separate control path for simultaneously absorbing and storing all PIP streams without stalling any I/O source resource incoming data stream, wherein the control path is provided for unicast traffic, and the interposed AMPIC DRAM system is separated into an AMPIC Quality Of Service (QOS) memory for enabling priority control, and an AMPIC LINK memory for enabling packet reassembly at I/O destination resources.

9. Apparatus as claimed in claim 8 wherein the AMPIC QOS and AMPIC LINK memories are respectively fed start of packet (SOP) control information, and continuation of packet (COP) and end of packet (EOP) information derived from the incoming PIP stream.

10. Apparatus as claimed in claim 9 wherein the central shared memory AMPIC DRAM utilizes independent serial interfaces and data buffers arbitratively switch-connected under a dynamic configuration.

11. Apparatus as claimed in claim 10 wherein the memory in the separate control path is provided with a number of available PIP buffers that is equal to the number of data buffers provided in the AMPIC DRAM central memory, thereby enabling the control path to absorb enormous bursts of PIP streams without stalling any I/O resource data stream.

12. Apparatus as claimed in claim 9 wherein the control path is also provided with a multicast data traffic control path, and in which a further AMPIC DRAM memory is interposed therein for temporarily storing multicast SOP PIP data.

13. Apparatus as claimed in claim 12 wherein means is provided whereby the multicast SOP PIPs are exploded and interleaved fairly with the unicast path SOP PIPs, and then written into QOS fifo queues.

14. Apparatus as claimed in claim 9 wherein the SOP PIP information for writing into the AMPIC QOS memory is derived form the I/O source resource PIP streams through PIP processor staging fifos, with such memory being partitioned into QOS fifos, and with processor fifo pointers supplying addresses based on the QOS priority field stored in the SOS PIP.

15. Apparatus as claimed in claim 14 wherein the SOP PIP contains the relevant information for scheduling a data packet or cell, including channel and interface number, packet byte count and QOS priority, in a PIP scheduler comprising buffer read addresses for the central memory.

16. Apparatus as claimed in claim 9 wherein the COP/EOP PIP information for writing into the AMPIC COP/EOP LINK memory is derived from the I/O source resource PIP streams through PIP processor staging fifos, with such memory storing the link address embedded in the PIP for supplying the next buffer addresses in the packet or cell.

17. Apparatus as claimed in claim 16 wherein the splitting of the SOP and COP/EOP PIPs in the unicast path serves to maintain output bandwidth and predictable latency through the control path, with all COP/EOP PIPs being written to the LINK memory, and with no interaction with the QOS memory.

18. Apparatus as claimed in claim 17 wherein means is provided whereby the COP/EOP PIPs are stored with the corresponding SOP PIPs in the QOS fifo memory, and with the COP/EOP PIPs that are destined for the same queue from the I/O resource, ending up interleaved in the fifo.

19. Apparatus as claimed in claim 18 wherein the PIP sequencer is provided with means for dequeueing the SOP PIPs from the QOS memory using the embedded byte count and bandwidth requirements for different priority queues to calculate the next time to send a packet, and all associated COP PIPs then follow at line rate.

20. Apparatus as claimed in claim 19 wherein the PIP sequencer is provided with means for dequeueing the remainder of the packet by stripping the link address from the SOP PIP and injecting it into the AMPIC LINK memory table.

21. Apparatus as claimed in claim 20 wherein means is provided for enabling a scheduler to dequeue the COP/EOP PIPs at said line rate or faster, in order to prevent read address starvation which could result in the filling up of said central shared memory.

22. Apparatus as claimed in claim 9 wherein the AMPIC QOS memory is partitioned into priority queues with external fifo read and write pointers.

23. Apparatus as claimed in claim 22 wherein internal contention for a particular DRAM bank is obviated by internal wide-bus access to the embedded DRAM banks and by the provision of I/O slots for temporarily storing buffer data until the corresponding DRAM bank can read or write the data.

24. Apparatus as claimed in claim 12 wherein means is provided for diverting incoming multicast SOP PIPs from the AMPIC QOS memory, the multicast index being stripped from the SOP PIP and injected into a read port on said further AMPIC DRAM memory which serves as the AMPIC multicast memory.

25. Apparatus as claimed in claim 24 wherein, in the event of a multicast traffic explosion, means is provided for creating a new SOP PIP by replacing the destination address, QOS priority and other fields in the original SOP PIP, but without changing the original buffer address of the data packet or cell, and means for multiplexing the new SOP PIP back into the data path for the AMPIC QOS memory under arbiter control with the same treatment as the unicast traffic.

26. Apparatus as claimed in claim 25 wherein means is provided for replicating the new SOP PIP multiplexing the same N times, simultaneously to explode N multicast SOP PIPs from N I/O resource PIP streams.

27. Apparatus as claimed in claim 25 wherein the multiplexing means comprises an N×N crossbar switch between the multicast data path and the unicast data path of the control path, enabling exploded multicast traffic to utilize idle write ports to the AMPIC QOS memory to drain the exploded multicast SOP PIPs into the QOS memory.

28. Apparatus as claimed in claim 25 wherein means is provided for requiring incoming multicast SOP PIPs to be stored in part of the AMPIC multicast memory until they can be processed, with such memory being organized into fifos provided with external logic for keeping track of read and write pointers thereof, thereby insuring that multicast SOP PIPs can be retrieved in the same order they came in so that no unfairness in queuing priorities is introduced.

29. Apparatus as claimed in claim 28 wherein the fifo memory storage is accessed by AMPIC multicast memory write ports, the multicast explosion only utilizing read ports thereof, and with the write ports absorbing multicast SOP PIP at the maximum PIP traffic rate.

30. Apparatus as claimed in claim 8 wherein each I/O resource is provided with used and free buffer address lists for the shared AMPIC DRAM memory.

31. Apparatus as claimed in claim 30 wherein, to accommodate the event that PIPs are returned to a source I/O resource because QOS queues are filled, and in order to avoid PIP return congestion, the used and free buffers each comprise AMPIC DRAMs for storing returned PIP information and, when the last PIP is returned, for clearing from the AMPIC used address memory and transferring to the AMPIC free address memory.

32. Apparatus for use in a network for interfacing parallel I/O data packet information packet (PIP) source resources with I/O destination resources through a central shared multi-port internally cached DRAM memory system (AMPIC DRAM) and a separate control path therefor, and wherein each I/O resource has the capability simultaneously to receive PIP data stream traffic from all the other I/O resources, said apparatus having a control path architecture for eliminating multicast data path traffic congestion, that comprises, interposing an AMPIC DRAM multicast memory in the control path for temporarily storing multicast start of packet (SOP) PIP data until such can be processed, wherein the multicast memory is organized into fifos provided with external logic for keeping track of read and write pointers thereof, thereby insuring that multicast SOP PIPs can be retrieved in the same order they came in so that no unfairness in queuing priorities is introduced.

* * * * *